United States Patent
Rust, III et al.

(10) Patent No.: US 9,590,573 B2
(45) Date of Patent: Mar. 7, 2017

(54) SYSTEM AND METHOD TO REMOVE HEAT FROM A POWER AMPLIFIER

(71) Applicant: The Boeing Company, Chicago, IL (US)

(72) Inventors: Thomas Rust, III, El Segundo, CA (US); Gregory Kim, El Segundo, CA (US); Jonathan M. Allison, El Segundo, CA (US); Michael A. Whelan, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 125 days.

(21) Appl. No.: 14/158,553

(22) Filed: Jan. 17, 2014

(65) Prior Publication Data
US 2015/0207465 A1    Jul. 23, 2015

(51) Int. Cl.
*H03F 3/04* (2006.01)
*H03F 3/21* (2006.01)
*H01L 23/427* (2006.01)
*F28D 15/02* (2006.01)

(52) U.S. Cl.
CPC ............ *H03F 3/21* (2013.01); *H01L 23/427* (2013.01); *F28D 15/0266* (2013.01); *H01L 2924/0002* (2013.01); *H03F 2200/447* (2013.01)

(58) Field of Classification Search
CPC ........................................... H03F 1/30
USPC .................................. 330/289; 361/702, 704
See application file for complete search history.

(56) References Cited

U.S. PATENT DOCUMENTS 5,901,037 A * 5/1999 Hamilton et al. ............ 361/699
2004/0040691 A1 * 3/2004 Jacque ................. F28D 15/043
165/42

* cited by examiner

*Primary Examiner* — Khanh V Nguyen
*Assistant Examiner* — Khiem Nguyen
(74) *Attorney, Agent, or Firm* — Toler Law Group, PC (57) ABSTRACT

In one aspect a satellite comprises a body, a solid state power amplifier, a heat acquisition and transfer device positioned proximate at least one heat generating element on the solid state power amplifier, and a heat rejection device in thermal communication with the heat acquisition and transfer device to reject heat acquired from the solid state power amplifier. Other aspects may be described.

20 Claims, 6 Drawing Sheets

SYSTEM AND METHOD TO REMOVE HEAT FROM A POWER AMPLIFIER

RELATED APPLICATIONS

None

FIELD OF THE DISCLOSURE

The subject matter described herein relates to a system and method to remove heat from a power amplifier and more particularly to a thermal radiating solid state power amplifiers which may be suitable for satellite applications.

BACKGROUND

Some aerospace systems have thermal management issues that are particular to the operating environment in which the systems operate. For example, satellites operate in an environment that has a wide range of environmental heat loads and in which the temperature between a side that is shielded from the sun and a side that is exposed to the sun may differ by hundreds of degrees Celsius. Electrical systems and attendant thermal management systems must accommodate these large variations in temperatures.

Accordingly, apparatus and methods for thermal management may find utility, e.g., in aerospace environments such as satellites.

SUMMARY

In one aspect, a system comprises a solid state power amplifier, a heat acquisition and transfer device positioned proximate at least one heat generating element on the solid state power amplifier, and a heat rejection device in thermal communication with the heat acquisition and transfer device to reject heat acquired from the solid state power amplifier.

In another aspect, a satellite comprises a body, a solid state power amplifier, a heat acquisition and transfer device positioned proximate at least one heat generating element on the solid state power amplifier, and a heat rejection device in thermal communication with the heat acquisition and transfer device to reject heat acquired from the solid state power amplifier.

In another aspect, a method to manage heat comprises transferring heat from at least one heat generating element on the solid state power amplifier to a heat acquisition and transfer device, transferring heat from the heat acquisition and transfer device to a heat rejection device, and rejecting the heat directly into space.

The features, functions and advantages discussed herein can be achieved independently in various embodiments described herein or may be combined in yet other embodiments, further details of which can be seen with reference to the following description and drawings.

BRIEF DESCRIPTION OF THE DRAWINGS

The detailed description is described with reference to the accompanying figures.

DETAILED DESCRIPTION

In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Geosynchronous satellites may be characterized as having multiple sides. By convention the forward side of a satellite refers to the side of a satellite which faces Earth and the aft side of a satellite refers to the side of the satellite which faces away from Earth. The remaining sides are referred to by cardinal orientation: north/south and east/west, assigned in accordance with their positions on a map. Thus, when facing the forward side of a satellite, the north side is the side which abuts the top of the forward side, while the south side is the side which abuts the bottom of the forward side. Similarly, when facing the forward side, the west side is the side which abuts the left side of the forward side and the east side is the side which abuts the right side of the forward side.

Briefly, in some examples the subject matter described herein addresses thermal management for electronic systems on space systems such as satellites by providing a system and method to remove heat from heat generating devices such as power amplifier assemblies which incorporates a heat acquisition device, which may be a convective device that is single phase or two phase (either a boiler or an evaporator) or a solid conductor. The heat acquisition device may be a single or two phase microchannel cooling circuit incorporated into the substrate of the power amplifier. The microchannel cooling circuit may be designed such that cooling fluid flows in close proximity to the power amplifier. More preferably, the microchannel cooling circuit may be designed such that cooling fluid flows in close proximity localized heat generating elements which may result in localized heat generating element areas during operation. The microchannel cooling circuit may include an evaporator portion proximate the power amplifier and a condenser portion removed from the amplifier. The condenser may be positioned on a radiating fin which, in turn, may be positioned on an east/west face of the satellite such that the condenser can radiate heat extracted from the power amplifier into the ambient environment of space.

In some examples the power amplifier may comprise Gallium-Nitride (GaN). The use of GaN materials may enable the amplifier to operate at higher temperatures including localized heat generating element temperatures of over 200 deg C. This allows for satellite designs in which heat may be rejected from a satellite side that is exposed to normal solar thermal loads. For example, satellites in a geosynchronous orbit generally receive more solar exposure on east/west sides than on north/south sides. The use of GaN power amplifiers renders it feasible to reject heat from an East/West side of a satellite. In further examples, the use of a GaN may allow for the power amplifier to be placed in locations on the satellite that generally receive more solar exposure such as the east/west sides of a geosynchronous orbiting satellite. Locating high power devices in locations where there is higher solar exposure may enable more optimized and efficient spacecraft design, for example less material required to transport the cooling fluid from a power amplifier to the radiator.

Additional features and examples will be explained below with reference to FIGS. 1-5.

Figure 1:
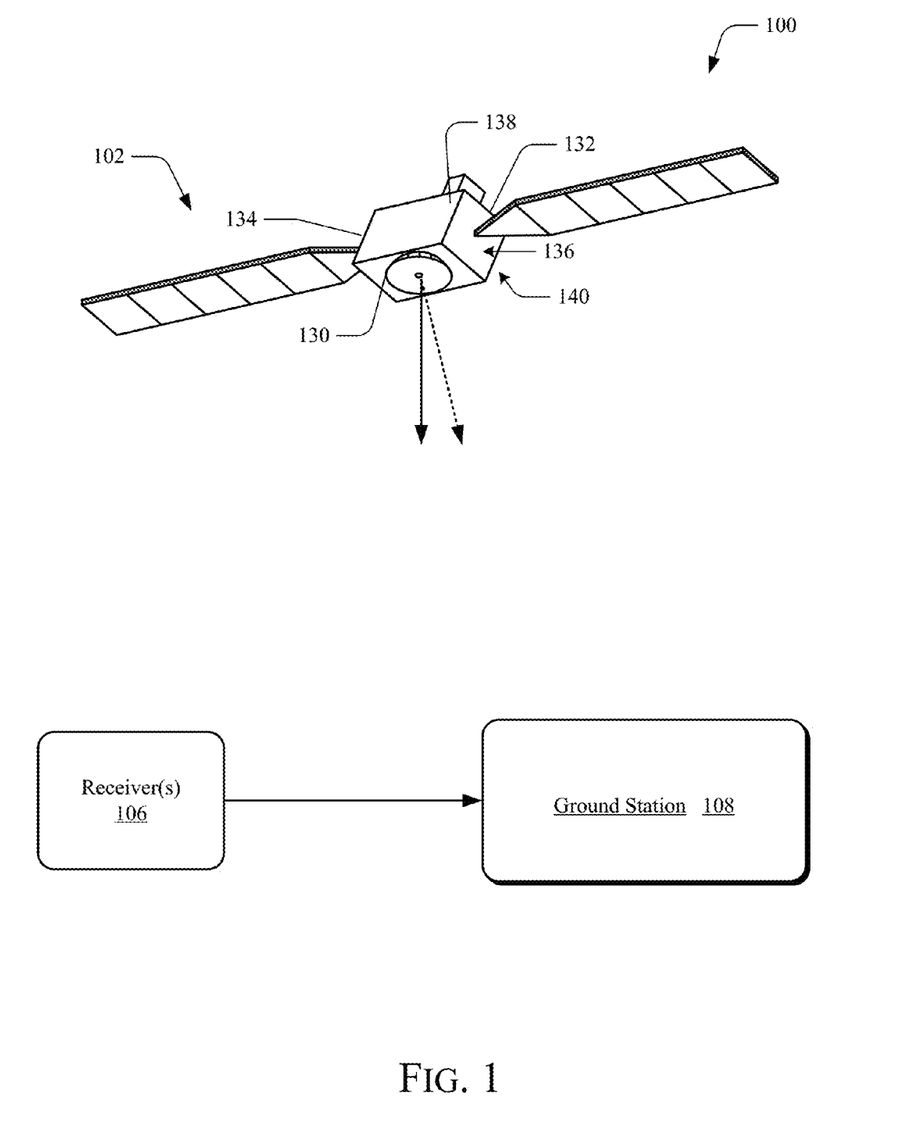
FIG. 1 is a schematic block diagram illustration of an environment which includes a satellite system which may include a thermal radiating power amplifier, according to aspects.

FIG. 1 illustrates an exemplary environment 100 in which embodiments of a thermal radiating solid state power amplifier can be implemented. The environment 100 includes a space system, such as a satellite 102, mobile ground-based or airborne receiver(s) 106, and a ground station 108. For example, the satellite 102 may be implemented as a communication platform or a positioning satellite.

Satellites such as satellite 102 may be characterized as having multiple sides. By convention the forward side 130 of a satellite 102 refers to the side of a satellite 102 which faces Earth and the aft side 132 of a satellite 102 refers to the side of the satellite 102 which faces away from Earth. The remaining sides are referred to by cardinal orientation: north/south and east/west, assigned in accordance with their positions on a map. Thus, when facing the forward side 130 of a satellite 102, the north side 138 is the side which abuts the top of the forward side 130, while the south side 140 is the side which abuts the bottom of the forward side 130. Similarly, when facing the forward side 130, the west side 134 is the side which abuts the left side of the forward side 130 and the east side 136 is the side which abuts the right side of the forward side 130. One skilled in the art will recognize that the satellite 102 need not be precisely in the shape of a rectangular prism as depicted in FIG. 1.

Figure 2:
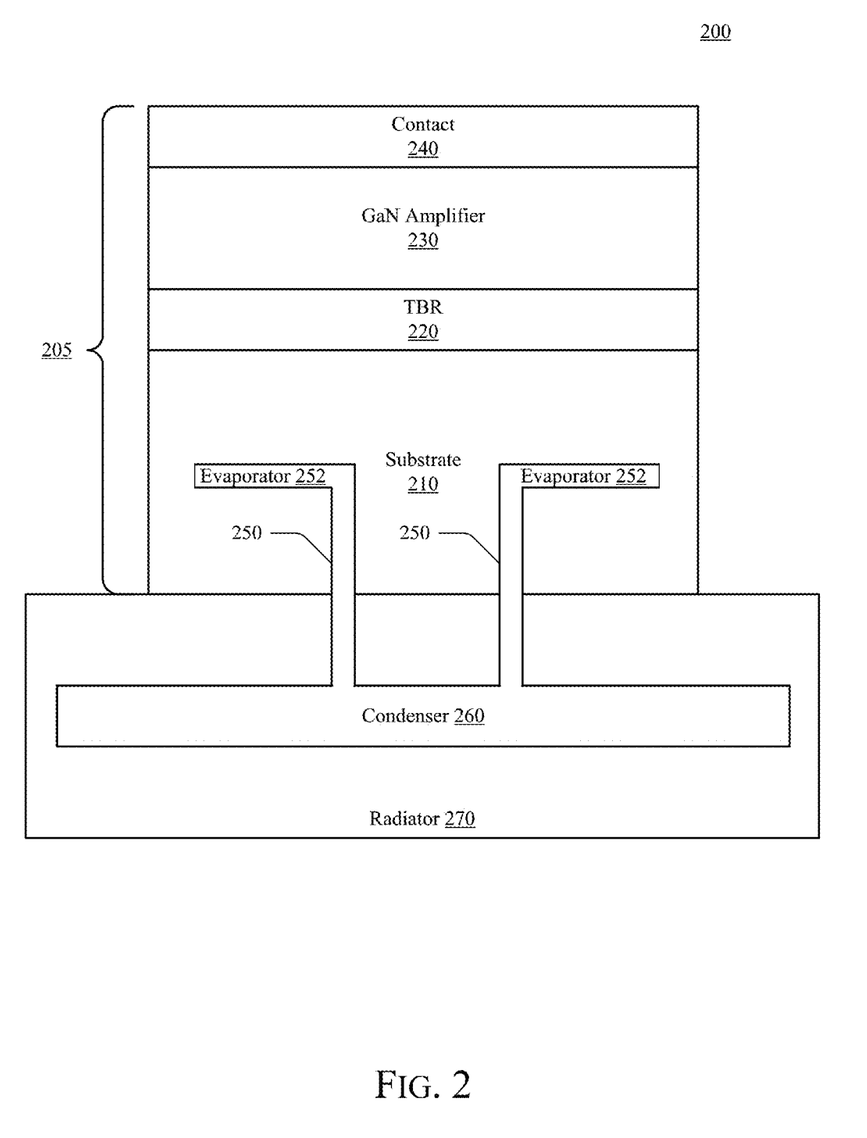
FIG. 2 is a schematic, cross-sectional view of a system to remove heat from a power amplifier assembly, according to aspects.

FIG. 2 is a schematic, cross-sectional block diagram of a thermal radiating power amplifier assembly, according to aspects. Referring to FIG. 2, in some examples, the assembly comprises a substrate 210 comprising a fluid filled microchannel cooling circuit 250, a solid state power amplifier 230 mounted on the substrate 210, and a first heat rejection device 270 coupled to the microchannel cooling circuit 250.

In greater detail, in some examples a power amplifier assembly may be formed as a semiconductor stack 205. The substrate 210 may be formed from a conventional semiconductor substrate material, e.g., Silicon Carbide (SiC) or the like. An amplifier layer 230 comprising Gallium Nitride (GaN) may be disposed on the substrate 210. From a heat management perspective, the intersection of dissimilar materials in the substrate 210 and the amplifier layer 230 defines a thermal boundary layer 220. A contact layer 240 may be disposed on the amplifier layer 230. In some examples the contact layer 240 may comprise Aluminum Gallium Nitride (AlGaN).

In the example depicted in FIG. 2, a microchannel cooling circuit 250 extends through portions of the substrate 210. In some examples the amplifier assembly 205 is formed on a die, the microchannel cooling circuit 250 comprises a plurality of microchannels 250 which extend proximate one or more heat generating elements on the die. The microchannel cooling circuit 250 may be filled with a thermal fluid, e.g., a refrigerant or organic fluid such as an alcohol. In addition, the working fluid may be a single phase, liquid, or two phase, a mixture of liquid and vapor.

In some examples the microchannel cooling circuit 250 comprises one or more evaporators or boilers 252 in the substrate 210. The specific location of the evaporator(s) or boiler 252 is not critical. Locating the evaporator(s) relatively higher in the substrate (i.e., closer to the GaN amplifier 230) reduces resistance in the solid components. In some embodiments the condenser 260 is embedded in a thermal two dimension or three dimension radiator 270.

Figure 3A:
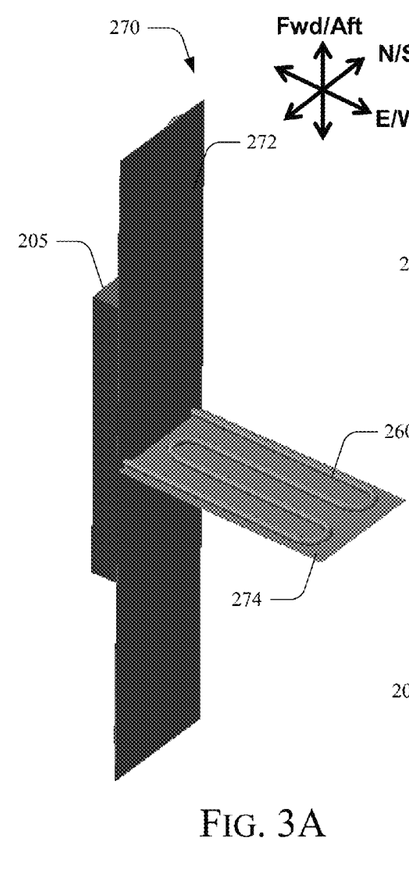
FIGS. 3A-3B are schematic illustrations of components of a system to remove heat from a power amplifier, according to aspects.
Figure 3B:
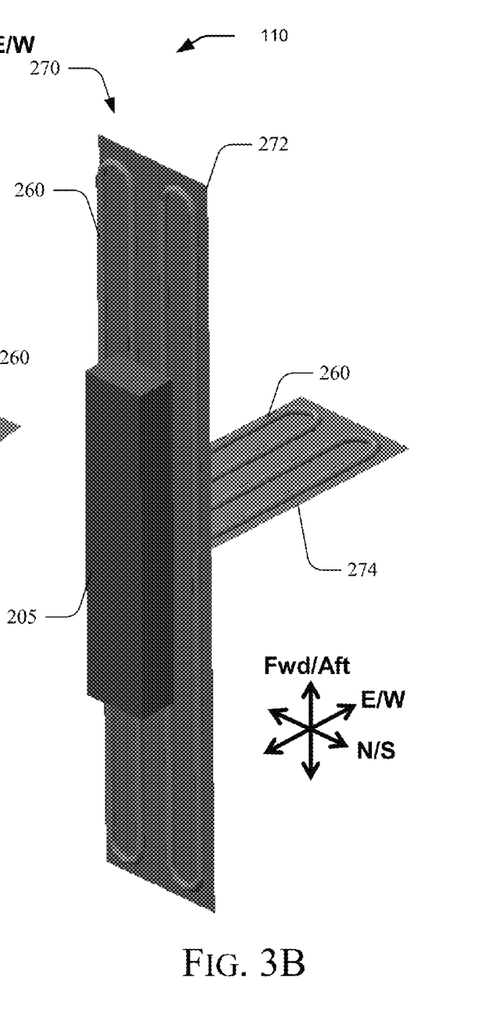

FIGS. 3A-3B are schematic illustrations of physical components of a system which may include a thermal radiating power amplifier, according to aspects. Referring to FIGS. 3A-3B, in some examples a solid state power amplifier assembly 205 may be coupled to a condenser 260 that is mounted on a radiator 270. The radiator 270 depicted in FIGS. 3A-3B may be substantially T-shaped and comprises a first panel 272 to which the solid state power amplifier assembly 205 is mounted and a second panel 274 extending from the first panel 272.

In some examples the radiator 270 may be formed from a suitably rigid material such that the radiator 270 may function as a structural load path for the condenser 260. For example, the radiator may be formed from an aluminum alloy, carbon fiber composite, or other high thermally conductive materials capable of operating at high temperatures. Inclusion of the second panel 274 reduces peak thermal environmental loads and diurnal temperature variations.

Figure 4A:
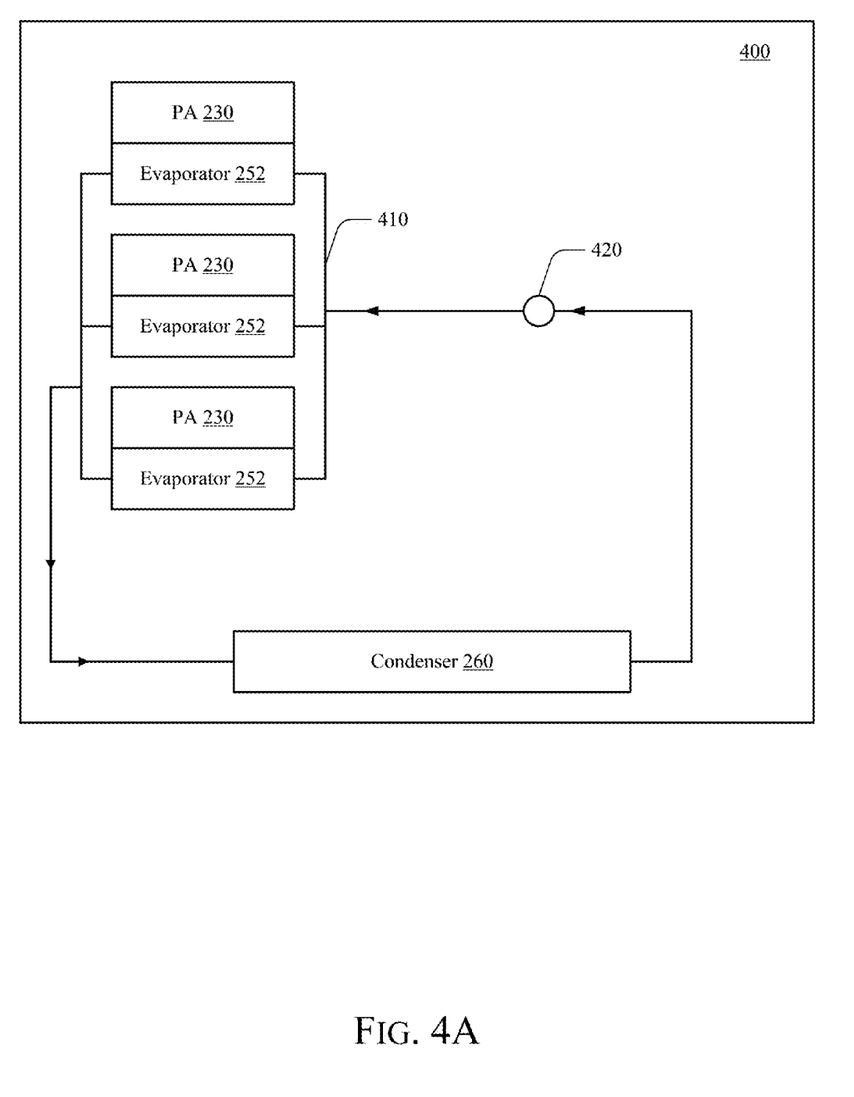
FIGS. 4A and 4B are schematic diagrams of components of a system to remove heat from a power amplifier, according to aspects.

Further, the T-shaped radiator 270 provides the ability to dissipate heat in two different planes. This feature may find particular utility when the radiator 270 is positioned on either a west side 134 of a satellite 102 or on an east side 136 of a satellite 102. In use, when the satellite is oriented such that radiation from the sun is incident on the first panel 272 at an approximately normal angle of incidence there is substantially no radiation incident on the second panel 274. Accordingly, heat in the thermal fluid circulating in condenser 260 may be dissipated when the fluid flows through the second of the condenser 260 on the second panel 274. Conversely, when the satellite is oriented such that radiation from the sun is incident on the second panel 274 at an approximately normal angle of incidence there is substantially no radiation incident on the first panel 272. Accordingly, heat in the thermal fluid circulating in condenser 260 may be dissipated when the fluid flows through the second of the condenser 260 on the first panel 272. Moreover, often shapes that distribute the radiative view over a wider solid angle may be implemented. Any convex shape will improve upon a flat, normal radiator FIG. 4A is a schematic diagram of a system 400 incorporating a thermal radiating power amplifier, according to aspects. Referring to FIG. 4A, in some embodiments the system 400 comprises a plurality of power amplifiers 230 in thermal communication with evaporators 252 in the manner described above with reference to FIGS. 2-3. A fluid circuit 410 provides a fluid communication path between the evaporators 252 and condenser 260. Thermal fluid may be driven through the circuit 410 by a pump 420, which may be implemented as a conventional positive displacement pump, an electrohydrodynamic (EHD) pump, or the like.

Figure 4B:
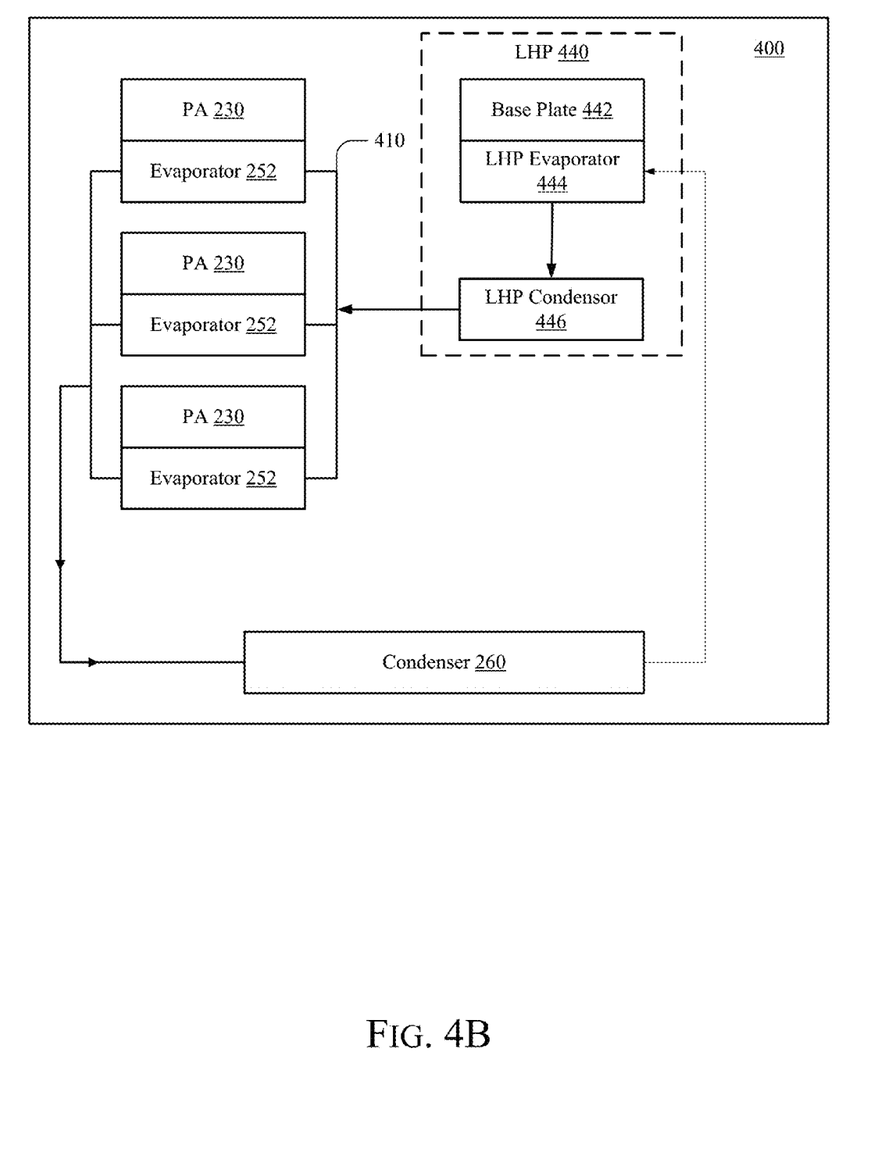

In other examples a system such as the system depicted in FIG. 4A may rely on a loop heat pipe (LHP) to pump fluid through the fluid circuit 410. FIG. 4B depicts a system 400 in which pump 420 is replaced with a loop heat pipe 440 comprising a base plate 442, an evaporator 444, and a condenser 446.

While the examples depicted in FIGS. 2, 3A-3B, and 4A-4B an evaporator and a condenser, one skilled in the art will recognize that other examples may use different heat transfer mechanisms. By way of example, in other examples a solid heat conductor may be used to conduct heat generated by amplifier 230 to a heat pipe capable of transporting heat at high temperatures and thence to a thermal radiator 270. A loop heat pipe or capillary pumped loop may be used to passively pump fluid through the system. The loop heat pipe or capillary pumped loop may be driven by evaporation of heat flow from the heat generating element of the power amplifier to be cooler or it may be driven by parasitic heat loads from cooler spots on the power amplifier and condensed before flowing into the heat acquisition device.

Another example of a heat acquisition and transport technology is an oscillating heat pipe (also known as a pulsating heat pipe) that functions via stochastic, pulsating flow of an ebullient mixture through a serpentine flow path that is driven by heat fluxes through local sections of the wall of the heat pipe envelope. Such an oscillating heat pipe design may be combined with other heat transport technologies described here and may be located near the heat generating element or nearer the radiator or may transport heat from the heat generating element all the way to the radiator. Further, the system may be protected from cold thermal environments by a combination of radiative and conductive insulation, adjustments to pumping rates, and by valving.

Figure 5:
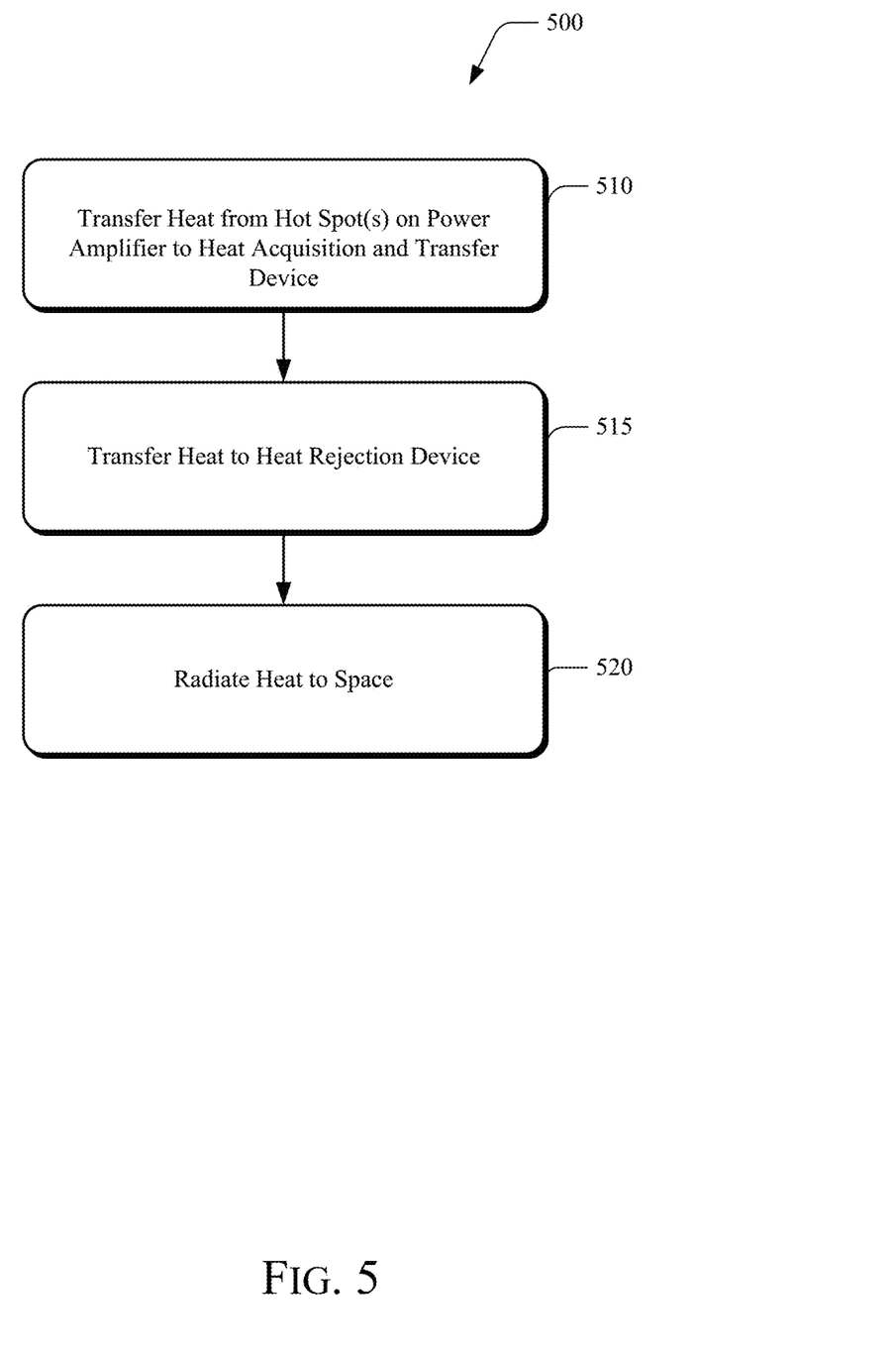
FIG. 5 is a flowchart illustrating operations in a method to operate a thermal radiating solid state power amplifier according to aspects.

FIG. 5 is a flowchart illustrating operations in a method 500 to operate a thermal radiating solid state power amplifier according to aspects. Referring to FIG. 5, at operation 510 heat is transferred from one or more heat generating elements on a power amplifier 230 to a heat acquisition and transfer device. For example in the embodiment depicted in FIG. 2, a thermal fluid is pumped through the microchannel cooling circuit 250 to transfer heat from the power amplifier 230 to the fluid in the microchannel cooling circuit. At operation 515 the heat is transferred to a heat rejection device. For example in the embodiment depicted in FIG. 2 the thermal fluid extracts heat from the power amplifier assembly 205 in the evaporators 252 and transfers the heat to the condenser(s) 260 on radiator(s) 270, where the heat is radiated (operation 520) into space.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A system, comprising:
   a solid state power amplifier;
   a plurality of microchannels configured to be in thermal communication with the solid state power amplifier;
   a condenser coupled to the plurality of microchannels, wherein the condenser is configured to dissipate heat from a thermal fluid circulating in the condenser; and
   a radiator including a plurality of radiating panels, wherein each of the plurality of radiating panels is configured to be in thermal communication with the condenser, and wherein the plurality of radiating panels are configured to enable heat to be radiated from a satellite in two different planes.

2. The system of claim 1, wherein the solid state power amplifier comprises Gallium Nitride.

3. The system of claim 1, wherein:
   the solid state power amplifier is formed on a die; and
   the plurality of microchannels extend proximate to one or more heat generating elements on the die.

4. The system of claim 3, wherein:
   the plurality of microchannels is coupled to an evaporator; and
   the condenser is embedded in the radiator.

5. The system of claim 3, wherein the radiator is located on one of a side of the satellite.

6. The system of claim 3, wherein the plurality of microchannels is coupled to an active pump, the active pump configured to pump the thermal fluid through the plurality of micro channels.

7. The system of claim 3, wherein the plurality of microchannels is coupled to a microchannel cooling circuit, the microchannel cooling circuit comprises a loop heat pipe, the loop heat pipe configured to passively pump the thermal fluid through the plurality of microchannels.

8. The system of claim 1, wherein the radiator is constructed of a thermally conductive material, an aluminum alloy, or a carbon fiber composite.

9. A satellite, comprising:
   a body;
   a solid state power amplifier;
   a plurality of microchannels configured to be in thermal communication with the solid state power amplifier;
   a condenser coupled to the plurality of microchannels, wherein the condenser is configured to radiate heat from a thermal fluid circulating in the condenser; and
   a radiator including a plurality of radiating panels, wherein each of the plurality of radiating panels is configured to be in thermal communication with the condenser, and wherein the plurality of radiating panels are configured to enable heat to be radiated from the satellite in two different planes.

10. The satellite of claim 9, wherein the solid state power amplifier comprises Gallium Nitride.

11. The satellite of claim 9, wherein:
    the solid state power amplifier is formed on a die; and
    the plurality of microchannels extend proximate to one or more heat generating elements on the die.

12. The satellite of claim 11, wherein:
    the plurality of microchannels is coupled to an evaporator; and
    the condenser is embedded in the radiator.

13. The satellite of claim 11, wherein the radiator is located on a side of the satellite.

14. The satellite of claim 11, wherein the plurality of microchannels is coupled to an active pump, the active pump configured to pump the thermal fluid through the plurality of microchannels.

15. The satellite of claim 11, wherein the plurality of microchannels is coupled to a microchannel cooling circuit, the microchannel cooling circuit comprising a loop heat pipe, the loop heat pipe configured to passively pump the thermal fluid through the plurality of microchannels.

16. A method to manage heat, comprising:
    transferring heat from at least one heat generating element on a solid state power amplifier to a plurality of microchannels in thermal communication with the solid state power amplifier;
    transferring heat from the plurality of microchannels to a condenser coupled to the plurality of microchannels, wherein the condenser is in thermal communication with a radiator that includes a plurality of radiating panels, wherein each of the plurality of radiating panels are configured to be in thermal communication with the condenser;
    transferring the heat from the condenser to one or more of the plurality of radiating panels; and
    radiating the heat directly from one or more of the plurality of radiating panels, wherein the plurality of radiating panels are configured to radiate heat in two different planes.

17. The method of claim 16, wherein the solid state power amplifier comprises Gallium Nitride.

18. The method of claim 16, wherein:
the solid state power amplifier is formed on a die; and
the plurality of microchannels extend proximate to one or more heat generating elements on the die.

19. The method of claim 16, wherein the plurality of microchannels is coupled to a pump, the pump configured to pump a thermal fluid through the plurality of microchannels.

20. The method of claim 16, wherein the plurality of microchannels is coupled to a microchannel cooling circuit, the microchannel cooling circuit comprises a loop heat pipe, the loop heat pipe configured to pump a thermal fluid through the plurality of microchannels.

* * * * *